(12) United States Patent
Koba

(10) Patent No.: US 6,819,469 B1
(45) Date of Patent: Nov. 16, 2004

(54) HIGH-RESOLUTION SPATIAL LIGHT MODULATOR FOR 3-DIMENSIONAL HOLOGRAPHIC DISPLAY

(76) Inventor: Igor M. Koba, 9210 Melody Dr., Savannah, GA (US) 31406

( * ) Notice: Subject to any disclaimer, the term of this patent is extended or adjusted under 35 U.S.C. 154(b) by 0 days.

(21) Appl. No.: 10/430,615

(22) Filed: May 5, 2003

(51) Int. Cl.[7] .............................. G02B 26/00; G02B 5/18
(52) U.S. Cl. ......................... 359/290; 359/292; 359/572
(58) Field of Search ................................ 359/237, 227, 359/230, 231, 572, 290, 292, 291, 298, 223; 422/129–131

(56) References Cited

U.S. PATENT DOCUMENTS

| | | | | |
|---|---|---|---|---|
| 5,311,360 A | * | 5/1994 | Bloom et al. ................ | 359/572 |
| 5,321,536 A | * | 6/1994 | Ishii et al. ..................... | 349/17 |
| 5,652,666 A | * | 7/1997 | Florence et al. ............... | 359/22 |
| 6,375,903 B1 | * | 4/2002 | Cerrina et al. ............... | 422/131 |
| 6,618,185 B2 | * | 9/2003 | Sandstrom .................... | 359/292 |
| 2003/0011860 A1 | * | 1/2003 | Okuyama et al. ............ | 359/196 |

* cited by examiner

Primary Examiner—Georgia Epps
Assistant Examiner—M. Hasan
(74) Attorney, Agent, or Firm—Arnall Golden Gregory LLP

(57) ABSTRACT

A high-resolution spatial light modulator and systems incorporating the modulator. The modulator includes an array of optically multistable reflective elements disposed on a substrate and each of the reflective elements are capable of structural change into one of a plurality of stable states wherein each of the reflective elements maintains a stable optical property. A computer selectively controls the state of the array of reflective elements to thereby cause each reflective element of the array to selectively reflect incident light such that the array of reflective elements can generate a desired holographical or optical image.

37 Claims, 4 Drawing Sheets

HIGH-RESOLUTION SPATIAL LIGHT MODULATOR FOR 3-DIMENSIONAL HOLOGRAPHIC DISPLAY

BACKGROUND OF THE INVENTION

1. Field of the Invention

This invention generally relates to display devices and their components. More particularly, the present invention relates to spatial light modulators for use in holographic display systems, optical information processing systems, direct-write lithography systems and adaptive optics.

2. Description of the Related Art

A spatial light modulator (SLM) is an optical device that allows modulation of incoming incident light with desired amplitude or phase pattern. Spatial light modulators are commonly used in projection television and display systems. Two common types of spatial light modulators used presently are digital micro-mirror device (DMD) and liquid crystal devices (LCD). Various types of DMDs are disclosed for example in U.S. Pat. No. 4,956,619, and U.S. Pat. No. 5,083,857. A digital micro-mirror device generally comprises a matrix of micro-mirrors suspended above a substrate of the device. A voltage is applied between the micro-mirror and electrode which allows individual adjustment of the light reflection angles of the micro-mirror, and thus control of the light reflection of the array is achieved.

Liquid crystal devices (LCD) typically comprise electrodes on the opposite sides of a layer of liquid crystal that changes polarization of incident light in response to an applied voltage. When no electric field is applied, light does not changes polarization and passes through the polarization filter; when an electric field is applied, the polarization changes and the polarization filter absorbs light.

These two types of spatial light modulators, DMD and LCD, are suitable and widely utilized for projection television and computer display systems. However, these spatial light modulators have technical and physical limitations that limit their usage in holographic systems and other modern technical applications that require high resolution, i.e. small size of pixels. The DMDs and LCDs typically have a geometric size of pixel elements on the order of dozens of microns. For example, a typical micro-mirror element has size of 10–20 microns ($\mu m$). Another disadvantage of existing spatial light modulators is that they have a long time of modification of the optical elements state, i.e. changing the image pattern, on the order of milliseconds.

There are other types of spatial light modulators used for specific applications. One such type is known as multiple quantum-well device that is comprised of multiple layers of semiconductor material sandwiched between transparent electrodes. The voltage applied to electrodes alters the absorption of light in the wavelength near the band gap of the material, which is typically GaAs or AlGaAs. An example of a multiple quantum well spatial light modulator, specifically for optical pattern recognition, is disclosed in U.S. Pat. No. 5,844,709. That device is designed to provide a combination of optically and electrically addressed spatial light modulators for the specific task of high performance pattern recognition. However, multiple quantum well devices are not well suited for other tasks of spatial light modulators because those devices can operate only in a limited spectrum of light near the band gap of the material, normally in the infrared spectrum. Further, the quantum-well modulator is difficult, and therefore costly, to fabricate with a large size of image area. Another type of spatial light modulator uses a magneto-optic material that changes polarization of incident light depending on the magnetization of pixel elements.

A further known type of light modulators is based on electro-optic materials that change their refractive index in response to an electric field. A first-order (linear) electro-optic effect, known as the Pockels effect, and a second-order (quadratic) electro-optic effect, known as the Kerr effect, occur in response to the electric field. Electro-optical devices typically utilize optical materials such as $LiNiO_3$ or lead zirconate titanate ceramic (PLZT). Such electro-optic light modulators are typically used for time-modulation of a light beam. But such devices are usually not designed and not suitable for spatial modulation of light specified by a 2-dimensional high-resolution pattern. Further, the size of a typical electro-optical modulator is quite big, so it is insufficient to serve as an element of a high-resolution spatial light modulator.

A classical electro-optical modulator is comprised of a wafer or volume of electro-optic material with electrodes attached to opposite sides of the material. Such device is capable of time-modulation of light beam. There have been attempts to make a compound optical system by combining multiple electro-optical modulators on one wafer. For example, U.S. Pat. No. 4,746,942, suggests a wafer of electro-optic material with a number of surface-mounted electrodes to form multiple independently operated electro-optic modulators. However, this type of device suffers from interference of the electric fields between electrodes, which limits how many modulators can be on one die. One solution to this problem is disclosed in U.S. Pat. No. 6,486,996, which suggests an optical system comprising a plurality of discrete protrusions of electro-optic material. Each discrete protrusion is electrically and optically isolated from each other. Such device permits multiple electro-optical modulators placed closely on one die. Nevertheless, that device is designed for time-modulation of a fixed number of light beams, such as used in printers and telecommunication. That device is not designed and not capable to perform at high-resolutions because the size of the optical elements (protrusions in electro-optic material) is far too large for displaying a high-resolution image pattern.

Holography is the application of optical technology best known for reproducing three-dimensional images. In addition to the simple production of 3-dimensional images, modern holography is used in broad range of applications, which includes, for example, holographic interferometers, optical memory systems, optical information processing systems, adaptive optics and may other technical areas. Typical holographic devices utilize film for recording the interference pattern of two beams of light, one reflected from the object and one reference beam. The two beams are created from a laser passed through beam expander optics and through a beam splitter that separates incident laser light into two beams. One fraction of the laser light is reflected from the beam splitter and directed toward the object, and a portion of light is reflected from the object and incident to a recording media (which is a film or glass plate covered with photographic emulsion). A second portion of laser light passes through the beam splitter and is reflected by a mirror toward the recording media such that the two laser light beams generate an interference pattern that is recorded on recording media. The photographic emulsion on the recording media is then developed by known photographic development process. The recorded hologram picture can be reconstructed by illuminating the developed film with the light beam at the appropriate incident angle, typically equal to the incident angle of the original reference light beam. The resulting reflected or transmitted light creates virtual or real image of the original object, depending on the setup of light beams during the recording. Some types of holograms may be observed (reconstructed) using conventional (non-laser) white light source. Other types of hologram may be observed only using laser light source.

However, the above process of creating hologram is only suitable for making a hologram of a static object, requiring an elaborate optical system well protected from vibration and external light. It also requires time for developing photographic emulsion on the recording media. It is therefore not suitable for recording images of moving objects.

Computers have been used to calculate interference patterns for holograms. However, constructing an operational high quality 3-dimensional holographic display is a technically difficult task. There are several attempts to design 3-dimensional holographic displays for moving images. A major difficulty in making holographic display arises from the fact that reproduction of a hologram interference pattern requires very high resolution of reconstruction media, on the order of a light wavelength $\lambda$. In fact, the distance between the fringes of holographic pattern resulting from the interference of two laser beams is typically on the order of light wavelength $\lambda$ in most holographic systems. This is the main reason why DMDs and LCDs are not able to reproduce the desired interference pattern with necessary resolution because their pixel resolution is on the order of dozens of microns, which is much larger than $\lambda$.

One attempt to construct an optical system for holographic display uses rotating or scanning mirrors to cover the required image area. As an example, U.S. Pat. No. 5,652,666 utilizes cylindrical lenses to magnify image from a DMD spatial light modulator in the vertical direction, and at the same time de-magnifies light in the horizontal direction to display one narrow vertical strip of the hologram image. A scanning mirror is then utilized to scan the image and display a composite consisting of many strips. A DMD device thus produces a hologram of the narrow strip of image, one at a time, and is illuminated by pulses of laser light synchronized with changing patterns and moving of the scanning mirror. In another example, U.S. Pat. No. 5,430,560 is for a device comprised of a light source, a rotating disk with sample holograms and a control unit that modulates light of light source in synchronization with the rotation of the hologram disk. In this and some other devices the 3-dimensional image is not generated as a whole, as hologram supposed to be, but by generating a small hologram area or even one pixel at a time and scanning the entire volume quick enough so that due to inertia of human vision it will be perceived as the whole image. There are many other schemes for holographic displays proposed using mechanical rotating or scanning elements and acoustical ultrasound elements to generate small parts of the hologram image.

One example of holographic display system proposed in U.S. patent application No. 20020176127 that provides system for displaying a real time moving three-dimensional hologram. The system provided in that invention comprises a computing device that generates hologram pattern (fringes) using a Fourier transform; a holographic pattern is displayed by DMD spatial light modulator that is illuminated by one portion of laser light. A reflected light is interfered with by another portion of laser light, firstly separated by beam splitter. Accordingly, the two portions of laser light interfere at a plane, which is allegedly produces a 3-dimensional holographic pattern.

U.S. patent application No. 20030016364 provides another example of a holographic recording and reproducing system. A system for hologram pattern acquisition disclosed in that application uses off-axis hologram recording setup, which is a variation of known "Michelson" interferometer geometry. Geometrical arrangement of the beam splitter, reference beam and the object beam is chosen such that two light beams are combined on image recording device at a very small angle, which increases the distance between interference fringes and thus allows acquisition of fringe patterns by a conventional CCD device. It further utilizes an elaborated digital image processing such as extended Fourier transform (EFT) to generate the hologram pattern suitable for reconstruction of image of the original object. The image is further reconstructed by system comprising laser, beam splitter, mirrors, spatial light modulator, lenses and light sensitive photorefractive crystal. Light modulated by spatial light modulator induces a holographic diffraction grating pattern in the volume of photorefractive crystal. The hologram image is than reconstructed by illuminating reconstructing light beam onto said photorefractive crystal. The disclosed device therein uses a LCD-type of spatial light modulator. Like all of the holographic 3-dimensional display devices described above, this device suffers from the physical resolution limitation of existing types of spatial light modulators.

Another technical field utilizing spatial light modulators is holographic optical memory and optical information processing systems such as pattern recognition systems. It is known that optical holography can be used for pattern and image recognition as well as a means for optical data memory. One example of optical content-addressable memory system is disclosed in U.S. Pat. No. 6,205,107, for an optical storage system that includes a spatial light modulator, a plurality of hologram storage volumes and a correlation-plane detector. An example of optical information processing device is disclosed in U.S. Pat. No. 5,497,253, which is for a device designed for pattern recognition that utilizes a spatial light modulator, a volume hologram for correlation processing, a correlation detector, and nonlinear processing elements for modeling neuron behavior. That device also includes means for selective feedback from the output information-processing plane to the input spatial light modulator for modeling behavior of multi-layer neural network.

The performance, physical sizes and information density of holographic optical memory and pattern recognition systems depends greatly on the characteristics of spatial light modulator utilized for data input. Significant improvement in spatial light modulators resolution technology is required in order to achieve an economical ratio of storage space versus the device cost. Improvement in speed of spatial light modulator elements is required to achieve faster response time and higher data throughput.

Another emerging technical field where spatial light modulators are used is direct-write optical lithography. A typical lithographic system used in semiconductor manufacturing comprises a light source, an optical system such as lenses and collimators, and a photo mask. An image from the photo mask is demagnified (typically by a factor of ¼ to ¹⁄₁₀) and projected upon a photosensitive polymer (photo-resist) layer on top of a substrate. A single photo mask is typically used to manufacture a number of identical chips. However, a spatial light modulator can replace the photo mask so that individual features on the substrate are determined dynamically by direct computer control. For example, U.S. Pat. No. 6,480,324 discloses such a system designed for producing a predetermined light pattern projected on the surface of the substrate under computer control. That system suggests using a LCD or DMD type of spatial light modulator. Accordingly, the direct write optical lithography is then used for synthesis of DNA arrays and polymer array synthesis, which particularly requires custom generated patterns for each element, and is not economically possible by conventional lithography. It would be desirable to extend same principle of direct write optical lithography for semiconductor manufacturing of small volume and experimental semiconductor devices, which do not require high volume production. However, existing types of spatial light modulators, such as DMDs or LCDs, do not provide sufficient resolution of pixels (elements) to produce patterns suitable for semiconductor manufacturing.

A further emerging technical field that utilizes spatial light modulators is adaptive optical systems. These systems are capable of optical compensation for distortions and aberration of a light beam in the atmosphere. Such systems are used, for example, in military applications for target tracking and aim-point selection. Some types of adaptive optical systems use deformable mirrors or lenses that are mechanically deformed under computer control in response to signals of waveform optical sensors. Other types of adaptive optics use optical phase conjugation and nonlinear optical devices. A third proposed type of adaptive optics known as "holographic interactive tracking" (HIT) is based on holographic principles. It includes the steps of illumination of a target by a laser beam and receiving the reflected light and recording the interference pattern of reflected light with a local oscillator beam. The resulting hologram pattern is digitally processed and transferred to a spatial light modulator where the hologram is generated. Laser light illuminating the spatial light modulator is directed toward the target and, due to the principles of conjugation, focuses on the target despite distortions and aberrations in the atmosphere. Examples of such systems are disclosed in U.S. Pat. No. 5,378,888, and No. 6,115,123. However, these types of systems are limited by the quality of holograms generated using existing DMD and LCD types of spatial light modulators and speed of updating the holographic image, which is a critical factor for tracking fast moving targets.

Chalcogenide materials (glasses) such as GeSbTe used in many electronic and optical devices. These materials have nonlinear optical properties, which make them useful for nonlinear optical fibers and filters. Chalcogenide materials are known to be able of reversible structural change between crystalline and amorphous state. These materials have highly nonlinear electrical conductance, which used in many devices. As an example, U.S. Pat. No. 5,757,446, is for a LCD light modulator (display) in which ovonic (chalcogenide) material is used for pixel switching (selection) element, which allows to apply voltage to the pixel located on the given intersection of address lines, instead of traditional switching elements such as a diode or transistor. However, the optical pixel element is a traditional liquid crystal and the pixels are subject to the same technological limitation of size, so that device is not suitable as high-resolution spatial light modulator.

Chalcogenide material is also used in data storage. A common example of storage is a rewritable optical disk. Such common optical disks as CD-RW and DVD-RAM routinely utilize physical and optical properties of chalcogenide materials. The disks incorporate a layer of reversible phase change material to allow the storage of information recorded optically through laser light. An example of an optical recording media that utilizes properties of chalcogenide materials is provided in U.S. Pat. No. 6,503,690, which discloses an optical recording media (such as a rewritable optical disk) with improved characteristics in repetitive recording and improved signal to noise ratio. The recording media is comprised of a recording layer containing Ge, Te and Sb and a diffusion-preventing layer in contact with the recording layer.

It has also been attempted to use phase-state changing material in semiconductor memory technology, and specifically for a non-volatile electronic memory device. These types of memory have been called "ovonic unified memory." (OUM) The OUM devices use semiconductor structures with chalcogenide material as memory elements on top of the substrate. The memory cells change phase in response to appropriately timed pulses of electrical current, with 10 nanoseconds "reset" time and 50 nanoseconds "set" time, and the cells can survive (i.e. do not degrade material properties) after at least $10^{12}$ cycles of re-programming. Such memory elements are provided in U.S. Pat. No. 6,314,014, and 6,480,438.

Accordingly, a spatial light modulator having a high resolution of pixel elements can be utilized in many optical applications. It therefore to such an improved high-resolution, spatial light modulator that the present invention is directed.

SUMMARY OF THE INVENTION

The novel spatial light modulator device provided in the present invention utilizes the property of reversible phase change materials, and particularly alloys known as chalcogenide materials, to construct a high-resolution spatial light modulator. The inventive spatial light modulator can be used in a broad range of technical applications such as holographic displays, optical information storage and adaptive optics. The invention includes specific embodiments of optical systems using the high-resolution spatial light modulator, including a 3D holographic display, a holographic optical memory, a holographic pattern recognition/neural network system, a direct-write optical lithography, and an adaptive optics system for moving target illumination/tracking.

The spatial light modulator is comprised of a substrate, an array of optically reflective elements, and a control, preferably a circuit, to selectively control state of optical elements. The optical elements (pixels) use material that is capable of reversible structural phase change in response to heat or an electric current. One such material is a chalcogenide alloy such as GeSbTe that exhibits reversible transition from amorphous to crystalline phase in response to heat. The apparatus utilizes the difference in optical properties such as reflectivity or refraction of such material in amorphous and crystalline state. In one embodiment, the control circuit is comprised of column and row address selecting wires and selection elements, such as transistors or diodes, in the intersection of wires.

The inventive spatial light modulator comprises optically reflective elements that can generate pixels preferably with geometrical sizes lesser than 0.5 microns. This size is an order of magnitude smaller than common types of spatial light modulators, such as DMDs and LCDs, thus permitting may novel optical devices and applications. Such improved pixel resolution permits using spatial light modulator for displaying high quality holograms as well as many other novel optical applications.

In another aspect of the present invention, there is provided a novel spatial light modulator that permits a very fast update of image pattern. If so embodied, the change of state of pixel elements can occur in about 10–50 nanoseconds (ns), which is a few orders of magnitude improvement compared to DMD and LCD spatial light modulators.

In yet another aspect of the present invention, there is provided a device having the novel spatial light modulator and utilizes its unique physical principles to yield properties of memory, i.e. once the pattern (image) is recorded, that pattern remains physically stored in the pixel elements until another pattern (image) is recorded and the physical structure of the elements changed. Thus, the device does not require any image refresh signal and does not consume power in maintaining the same image or logical state. The power is consumed only at a time when a new image is recorded by changing state of pixel elements. For this reason, the spatial light modulator also is suitable as a display for portable low power electronic devices.

In yet a further aspect of the present invention, there is provided a device having the novel spatial light modulator that utilizes its physical principles to permit not only electrical but optical programming. The image (pattern) can be adjustable to either electrical signals or incident light. As such, the device provides a foundation for novel class of electro-optical elements for information processing, such as opto-electronic neural networks and fuzzy logic devices.

In yet another aspect of the present invention, there is provided a device that can utilize the novel spatial light modulator for novel types of adaptive optics applications such as illumination and tracking of moving targets.

In yet a further aspect of the present invention, there is provided a 3-Dimensional holographic display system architecture utilizing the high-resolution spatial light modulator. The holographic display system can be used for displaying computer-generated holograms and holographic images of objects acquired by other means, such as radiolocation, ultrasound scanning, or magnetic resonance imaging. Moreover, the system can be utilized to provide remote images holographically to a viewer.

In yet another aspect of the present invention, there is provided a holographic optical switching system for programmable redirecting light between multiple optical fibers or optically interconnected chips, which advantageously utilizes the reduced size and improved characteristics of the high-resolution spatial light modulator.

In yet a further aspect of the present invention, there is provided a direct-write optical lithography system utilizing the improved resolution and characteristics of the high-resolution spatial light modulator to project fine light patterns for lithography.

Other object, advantages, and features of the present invention will become apparent after review of the hereinafter set for Brief Description of the Drawings, Detailed Description of the Invention, and the claims.

DETAILED DESCRIPTION OF THE INVENTION

Figure 1:
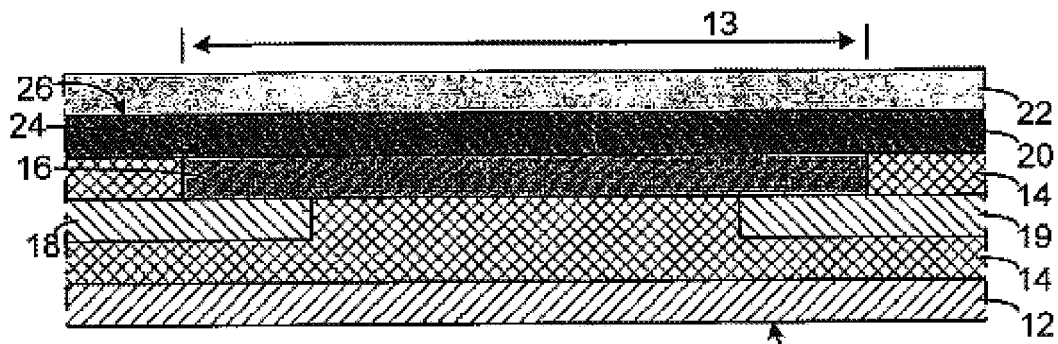
FIG. 1 is a cross-section of one embodiment of a reflective element of the inventive high-resolution spatial light modulator.

With reference to the drawings in which like numerals indicate like elements throughout, FIG. 1 is a cross-section of a high-resolution spatial light modulator 10 comprised of a substrate 12, and an array of optical reflective elements (pixels) is disposed on the substrate 12, one such optical element 13 shown as having a width thereof. The optical elements (pixels) are manufactured from material capable of reversible structural phase change in response to heat, or an electric current. One example of such phase-changing material is chalcogenide alloy, such as GeSbTe. Chalcogenide alloys exhibit reversible transition from amorphous to crystalline phase in response to heat. The alloy has drastically different physical and optical properties in amorphous and crystalline states. For example the electrical conductivity in the crystalline state is approximately 40 times higher than in the amorphous state. The optical reflectivity and refraction index of the material is also different in amorphous and crystalline stated. The spatial light modulator 10 thus works by selectively changing reflection or refraction index of the phase-changing material. The present invention is not limited to the use of chalcogenide alloy for the reflective elements. Other optically multistable materials can be used which exhibit reversible structural change in response to heat or electric current that affects the material's optical properties. One example of such alternative material is a matrix resin and an organic low molecular weight material dispersed in the matrix resin, which is disclosed in U.S. Pat. No. 6,489,265.

It is preferred that the width of the optical element 13 approximate a light wavelength $\lambda$ such that a very high resolution from the array can be achieved. For certain of the embodiments described herein, the width can be several wavelengths (m$\mu$) and accomplish the desired goal. However, for holographic display to a viewer, the width must be $\lambda$ or smaller to achieve the desired holographic fringes of the image.

One embodiment of reflective optical element of spatial light modulator is depicted on FIG. 1 as including a semiconductor substrate 12, an insulation layer of, for example, $SiO_2$ 14, a resistive element 16 with contact areas 18 and 19 that is connected with other electrical circuits (not shown here), and a layer (film) of chalcogenide alloy 20 covered by transparent protective layer 22. The chalcogenide alloy 20 is a merely one form of material that has multiple optical states that can be used in the present invention. The layer of optically multistable material can be deposited as a continuous film or separated into islands of material, depending on the required application and pixel characteristics. The electric current passing through the resistive element 16 causes momentary melting of the alloy 20, which can solidify in either crystalline or amorphous state depending on the duration and current of the electric pulse. The underlying electric circuit (not shown on the picture) is responsible for selectively switching electric current in the resistive element 16. The electric circuit can be designed as a grid of row and column address lines (wires) to selectively access every pixel element by its row and column address, as is known in the art of display control. The intersection of address lines can comprise diodes or transistors that enable selective distribution of programming electric current to the resistive element 16. In other embodiments, the electric current can pass directly through the volume of chalcogenide alloy, thus eliminating the need of using resistive element 16.

The state of the reflective element 13 can thus be reversibly changed from amorphous to crystalline phase and back by heat produced by electric current. A short pulse of current produces heat and melts the material. When the electric current pulse is intensive but short (for example about 10–15 nanoseconds) the material solidifies in a amorphous state. When the electric current pulse is relatively longer (about 40–50 nanoseconds) but less intensive, the material solidifies in a crystalline state. The material has different optical properties in amorphous and crystalline state, which allows generation of desired pattern of optical cells. That pattern alters the form of reflected light beam. In other embodiments, the optical cells can be fabricated on the transparent substrate such as glass or polymer material. The electrical wires of underlying circuit and resistive elements can be fabricated from thin transparent films. In such case, it is possible to utilize the high-resolution spatial light modulator in the transmission mode by illuminating the light beam through the transparent substrate. It should be appreciated that present invention is not limited by using only chalcogenide alloy material for optical cells. Other optical materials can be used, such as photopolymer and photorefractive crystal, as long as the material is capable to reversibly change its optical properties such as its refraction index or absorption, or reflection of light in response to electrical current or heat. It is preferable that material of optical cell shall remain in the same structural phase state when no electrical signal is applied.

In other embodiments, the reflective elements are made of material that reversibly changes its thickness or volume in response to electrical current or heat. The phase of light reflected from surface 26 will change depending on the thickness of the multistable material. In this case, the device is capable to controllably modulate phase of reflected light in accordance with the specified pattern, and can generate a phase shifting hologram.

The shape of optical element and shape or optical elements array is determined by application. In one embodiment, the shape can comprise rectangular optical elements arranged into rectangular grid of such elements. In another embodiment, the shape may comprise, for example, hexagonal optical elements arranged in hexagonal grid of elements.

The thickness of multistable material, such as the chalcogenide alloy film 20, and size and shape of optically reflective elements 13 (and thus pixels) and angle of illuminating light beam can be selected in order to maximize optical characteristics such as contrast ratio and reflectivity of the optical device. The angle of incident light and thickness of chalcogenide alloy film 20 and wavelength is chosen such that reflected light from lower surface 24 of the reflective element 13, such as resistive element 16, exhibit constructive interference with the light reflected from the upper surface 26. Thus the reflection of light is increased. In the other optical structural state of material the refraction index is changed, so the reflected light from lower surface 24 exhibit destructive interference with the light reflected from the upper surface 26. The reflection of light from the reflective element 13 is thereby reduced.

It is a known property of chalcogenide alloys that light reflectivity of bulk material in amorphous and crystalline states is different by approximately 2 times. That difference in reflectivity is sufficient to produce a hologram when illuminated by a light source 56 (in FIG. 3) at appropriate angle a. If other technical application requires higher ratio of reflectivity, it can be improved by selection of appropriate material among many known chalcogenide alloys.

Figure 2:
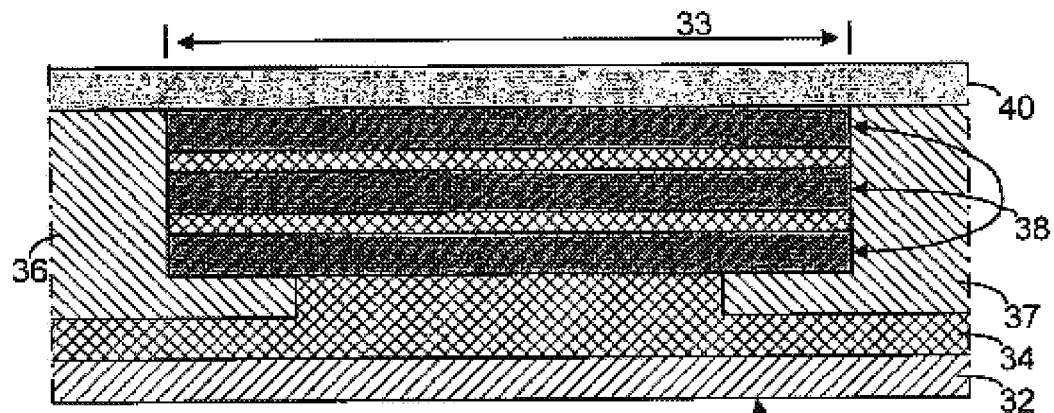
FIG. 2 illustrates an embodiment of a multi-layer reflective element structure.

As shown in FIG. 2, another embodiment of the spatial light modulator 30 includes a reflective element 33 comprised of a semiconductor substrate 32, insulating layer 34 of, for example $SiO_2$, contact areas 36 and 37 in connection with other electrical circuits (not shown here), and multiple layers of chalcogenide alloy 38 covered by transparent protective layer 40. In this exemplary embodiment, a current passes directly through layers of the chalcogenide alloy 38, so a separate resistive element is not used. Other embodiments may, however, utilize the resistive element 16 of FIG. 1.

Referring again to FIG. 1, in the modulator 10, there can be additional reflective layers (films) and protective layers, for example $SiO_2$ above and below optical layer of chalcogenide alloy 20. The device may further comprise an additional reflective film of, for example Al, below the chalcogenide alloy layer 20. In such case, the variation in light absorption in amorphous and crystalline states can be used to generate an image, instead of reflectivity. The device may further comprise multiple thin layers (films) of chalcogenide alloy divided by layers of other material as shown in FIG. 2. Such multi-layer structure with corresponding choice of angle of input light beam and corresponding choice of light wavelength $\lambda$ can provide condition for interference of wave fronts reflected by layers of multi-layer structure and thus can greatly increase the ratio of reflectivity in the "open" and "close" state of optical elements. In this embodiment, the variation of refraction index of chalcogenide alloy material is utilized, in a combination with the variation of reflectivity. By the physical principles of operation of the high resolution spatial light modulator 10 provided in the present invention, after the pattern is recorded by altering states of array of reflective elements, the emitted pattern remains unchanged until the next pattern is recorded. In other words, the device does not need constant picture refresh signals like LCD and DMD devices, and does not consume power like light emitting diodes (LED). This allows fabrication of display devices that do not consume power when displaying static image. Only when the picture is changing the electric power is consumed to alter state of the reflective elements 13. Such display devices are suitable for portable electronic devices and battery power equipment where power consumption is a critical parameter.

Another unique advantage of the high-resolution spatial light modulator 10 provided in the present invention is that it allows a greatly increased speed of operation, comparatively to DMD and LCD devices. As described above, the time of changing state of the reflective element 13 is on the order of dozens of nanoseconds (ns). More specifically, the electric current pulse required for setting amorphous state of chalcogenide alloy material in the reflective element 13 is approximately 10–15 nanoseconds (ns), and time for setting an amorphous state of chalcogenide alloy material is approximately 40–50 nanoseconds. Such is several orders of magnitude faster than DMD and LCD devices. This property allows updating of the entire reflected image very quickly as long as the current propagation and computing devices are capable to deliver new image data with the necessary speed. The speed of operation is especially important for real time image processing and pattern recognition systems and for novel adaptive optics devices for recognizing, classifying, and tracking fast moving targets, as is further shown herein.

Alternately, the reflective element 13 of the high-resolution spatial light modulator 10 can be embodied to remain in a intermediate state by applying an electrical pulse with intermediate values of current and duration. Through such method, a fraction of material of the array or individual reflective element can become crystalline with other portions of the material remaining amorphous. In such manner, the spatial light modulator 10 can reproduce intermediate level of pixel luminance, i.e. it is capable to reproduce grayscale, unlike common DMD devices that generally allow only two stable states of pixel elements: "on" and "off."

The physical and optical state of the reflective element 13 can be altered not only by applying electric current but also by an external light source, for example, by pulses of a laser light beam directed on the substrate with a predetermined sufficient intensity and pulse duration. This allows for the high-resolution spatial light modulator 10 to be used in pattern recognition apparatuses or artificial neural networks with all-optical feedback that receives input signals at least optically through incoming light beam. The incoming light beam may directly write a new pattern or selectively heat up a portion of device surface, which changes sensitivity of the reflective element to an electric current or alters some part of the image. And conversely, a pulse of electric current applied to the resistive elements may selectively heat up one or more of the reflective elements 13 and thus change sensitivity to the recording laser light pulse.

Figure 3:
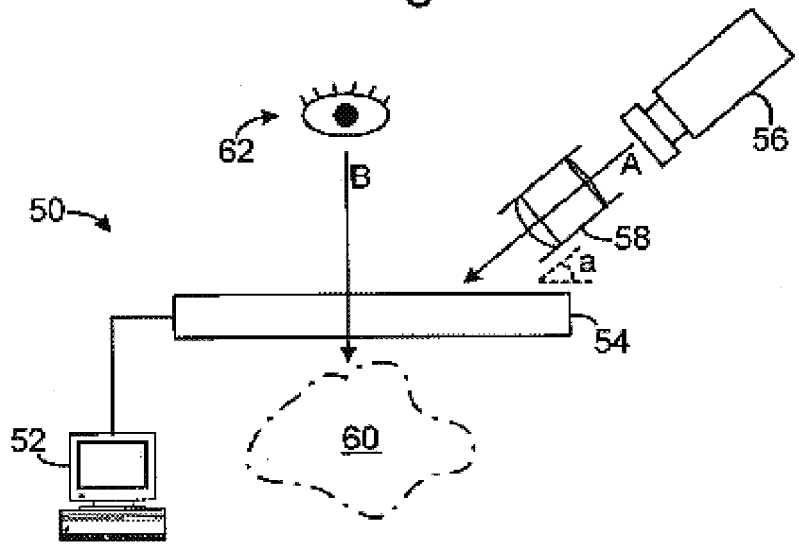
FIG. 3 is an illustrative diagram of a 3-Dimensional holographic display device using the spatial light modulator.

FIG. 3 illustrates one embodiment of a 3-Dimensional holographic display system 50 including the high-resolution spatial light modulator 54, a light source 56 (preferably laser) and collimating optics 58. A computer 52 or digital image processor computes the hologram interference pattern to generate 3 dimensional holographic image using a Fourier transform or Extended Fourier transform. In this design, the geometrical size of pixel elements on this type of spatial light modulator 54 will be equal to or smaller than wavelength $\lambda$, which allows reproducing hologram pattern (fringes) with fine level of details necessary for displaying hologram. In operation, the high-resolution spatial light modulator 54 is illuminated by light from laser 56 directing beam A through collimator lenses 58 onto the modulator 54 at an angle a. The laser light reflected by hologram pattern results in a virtual hologram image of object 60 when seen by viewer 62 through line of sight B. The hologram pattern (fringes) is computed by computing device 52. The depicted embodiment of the device uses reflection-type hologram, which produces virtual object image, visually perceived as located behind the surface of spatial light modulator. This type of hologram may also be viewed using natural (con-coherent) light source. Color 3-dimensional hologram image can be displayed by overlaying in the spatial light modulator 54 interference patterns corresponding to several wavelengths and illumination by several lasers or other light sources with several wavelengths $\lambda$. Other optical elements such as lenses, mirrors, beam splitters can be used in the system 50 to alter the light beam, and the light source 56 can be a laser, high-intensity light, or other powerful light source sufficient to generate the hologram. Other hologram viewing setups known in the art of holography can be utilized as well with the spatial light modulator 54 being used in place of traditional film or glass covered by photo emulsion.

The provided holographic display system 50 may be used for displaying computer-generated holograms and for holographic visualization of 3-dimensional images acquired by other means. The image of object acquired, for example, by radiolocation or ultrasound scanning or magnetic resonance imaging, is digitally processed by Fourier transform or extended Fourier transform (EFT) and the digitally generated hologram pattern is transferred to the high resolution spatial light modulator 54 provided in the present invention. When the high-resolution spatial light modulator 54 is illuminated by laser beam A, the viewer 62 accordingly sees 3-dimensional holographic image 60 corresponding with previously acquired data.

In another embodiment, holographic display system 50 can be used to provide holographic "television." That is, a hologram image of a remote 3-dimensional scene is acquired in the transmitter, transmitted over the telecommunication channel and reproduced by the receiver. In one embodiment, a 3-dimensional scene is acquired into digital form by either one of the following two methods. Hologram image of 3-dimensional scene is acquired in the transmitter using one of known holographic setups, comprising laser, beam splitter for splitting onto object and reference beams, mirror for reflecting light beam, and array of photodetectors. Object beam illuminates the scene, and reflected light interferes with the reference beam in the plane of array of photodetectors. A hologram pattern is acquired in the transmitter by high-resolution array of photodetectors and converted to digital data.

A second method of acquiring 3-dimensional scene is based on extension of stereoscopic imaging, and comprises multiple cameras recording scene from a plurality of viewing angles. By either one of said two methods the complete digital representation of 3-dimensional scene is produced. Digital processing system processes digital hologram data or stereoscopic image data to reduce redundancy. The complete digital representation of hologram can comprise enormous amount of data, typically thousands of times greater than data of 2-dimensional picture. A direct transmission or storage of such amount of data appears not possible or too expensive in the near future. Traditional methods of compressing images and video data are not suitable for holographic image. Loss-less methods will not compress data well enough, and more effective methods, which permit some loss of picture information, will destroy the hologram image. Therefore, this embodiment comprises digital processing system, which reconstructs the entire 3-dimensional image from the holographic or stereoscopic representation, and than categorizes image and extracts geometrical description of 3-dimensional objects. In one embodiment, it performs 3-dimensional image recognition and extraction of 3-Dimensional scene description, comprising description of shape and visual properties of 3-dimensional objects. Preferably, the compressed digital representation of hologram shall be independent from the technical methods of both acquiring and displaying, such as modern virtual reality modeling language (VRML). In other words, it shall preferably comprise a standard-based technologically independent representation of 3-dimensional scene that can be displayed using different display devices, including, for example, holographic and stereoscopic displays. The standard-based technologically independent representation of 3-dimensional scene is transmitted from transmitter to receiver by telecommunication channel. Receivers can be equipped with different types of display devices, including holographic and stereoscopic displays. The best image quality and best viewing experience is achieved when 3-dimensional scene is viewed using holographic display.

The holographic television receiver comprises digital processing system that converts said compressed digital representation of hologram to the complete hologram pattern. The digitally reconstructed hologram pattern is transferred to the high-resolution spatial light modulator 54, and when spatial light modulator 54 is illuminated by laser beam A, the viewer sees a 3-dimensional holographic image representing the remote image of 3-dimensional scene. The pattern can be updated frequently enough so that the viewer sees a moving picture, which typically occurs at refresh rate least 24 times per second. Alternatively, the stereoscopic receiver converts same compressed digital representation of 3-dimensional scene to the complete stereoscopic image corresponding to the desired angle of view.

Figure 4:
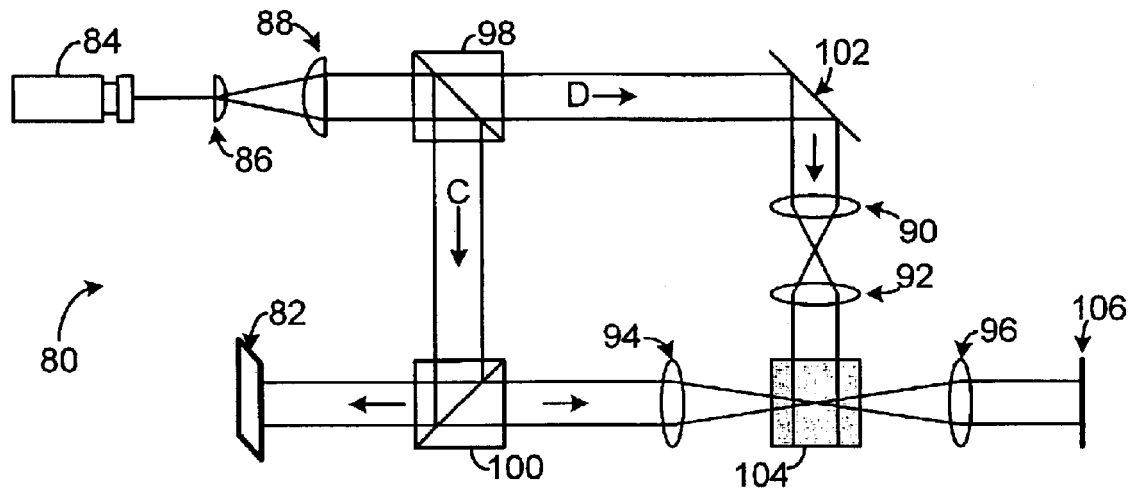
FIG. 4 is an illustrative diagram of a holographic optical memory system using the spatial light modulator.

Referring to FIG. 4, there is shown an embodiment of a holographic optical memory system 80. This example shows one of many possible known geometries of holographic memory with angle-multiplexing and 90° geometric arrangements. The memory system 80 comprises high-resolution spatial light modulator 82, laser 84, beam expander 86, lenses 88, 90,92,94 and 96, beam splitters 98 and 100, rotating mirror 102, hologram storage volume 104, and image detector 106. When recording data, light from laser source 84 passes through beam expander 86 and is then split into object and reference beams by splitter 98. The object beam is passing in the vertical direction, depicted by Arrow C, and reference beam is passing horizontally, depicted by Arrow D. The object beam reflects from second beam splitter 100, reflects back from the spatial light modulator 82, which modulates beam with a specified image pattern. Then the object beam passes through the beam splitter 100 in the opposite direction, passes through the lens 94 which focuses the image, and then passes through the hologram storage volume 104 made of photorefractive material, such as LiNi or BaTiO$_3$.

The reference beam reflects from the rotating mirror 102 that provides angle-multiplexing of stored holographic images. Rotating mirror 102 changes the angle position by pre-defined angles after data recording. The reference beam reflected from the rotating mirror 102 passes through lenses 90 and 92 and passes through hologram storage volume 104 where the beam interferes with the object beam and forms an interference pattern stored in the volume of photorefractive material. When reading data, light only passes through the reference path of the optical system 80. The object beam is preferably cancelled by shatter (not shown on the picture). Rotating mirror 102 is positioned at the same angle that used initially for recording data. Light reflects from the rotating mirror, passes through lenses 90 and 92 and passes through hologram storage volume 104. Light reflects from the hologram interference pattern stored in the volume of photorefractive material, thus producing virtual image of the stored data pattern. Reflected light passes through lens 96 and incidents onto image detector 106, which detects the reconstructed data pattern. Multiple patterns of data can be stored at the same time in hologram storage volume 104. A specific pattern is selected by changing the angle position of rotating mirror 102. Using the high-resolution spatial light modulator 82 described in the present invention improves characteristics of the optical memory system 80, such as storage capacity, speed of recording and reading data, and reduces size of the system 80.

Figure 5:
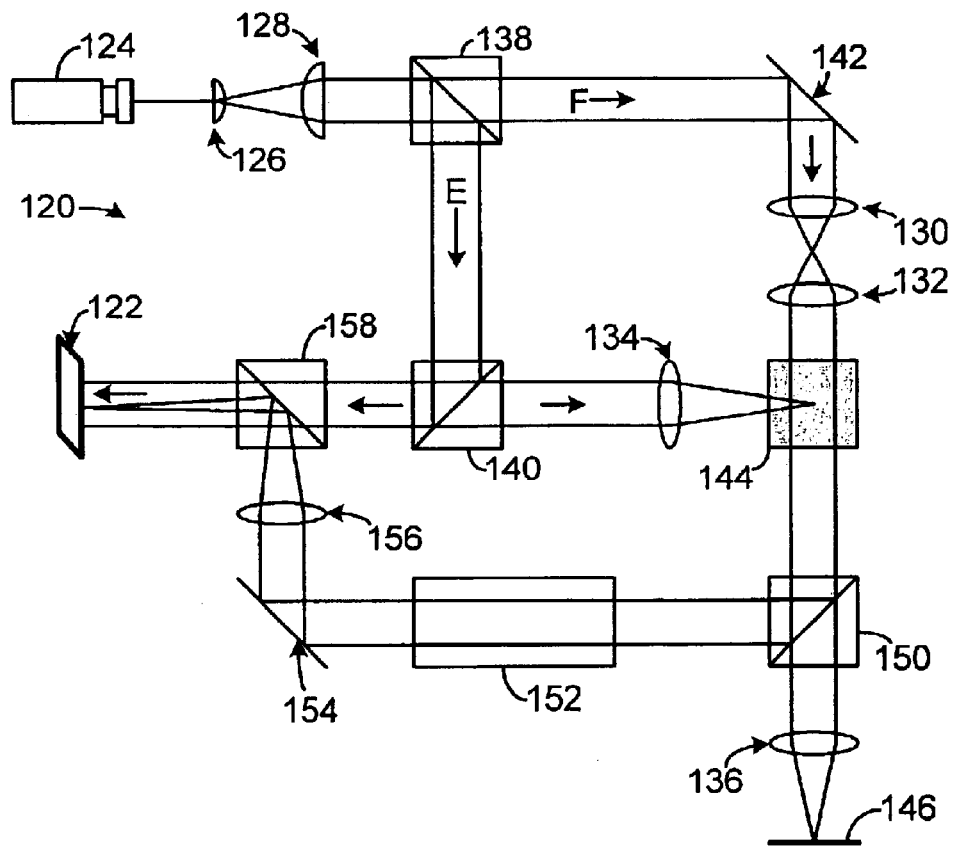
FIG. 5 is a holographic optical neural network and pattern recognition system utilizing the spatial light modulator.

FIG. 5 illustrates one embodiment of a holographic optical neural network and pattern recognition system 120. The system 120 is comprised of a high-resolution spatial light modulator 122 that modulates input beam from laser 124, a hologram storage volume 144, an array of photo detectors 146. Elements 150–158 provide optional optical feedback as further described herein below. When recording a hologram, light from laser 124 passes through beam expander 126, lens 128, beam splitter 138. Beam splitter 138 splits the light beam into two beams, an object beam and reference beam respectively. The object beam is depicted as reflected in the vertical direction, as shown by arrow E, and reference beam as passing horizontally, as shown by arrow F. The object beam reflects from second beam splitter 140 and passes through the beam splitter 158. The object beam reflects back from the spatial light modulator 122, which modulates the beam with specified image pattern. Then the object beam passes through the beam splitter 140 in the opposite direction, passes through the Fourier lens 134 that focuses the image, and passes through the hologram storage volume 144 made of photorefractive material, such as LiNi or BaTiO$_3$. The reference beam reflects from the rotating mirror 142, passes through lenses 130 and 132 and interferes with the object light in the hologram storage volume 144. Rotating mirror 142 changes angle position after every data recording by a pre-determined angle. When reading data (detecting or classifying unknown pattern) light only passes through the object beam path of optical system 120. The reference beam is cancelled by shatter (not shown). Light is modulated with unknown pattern by the spatial light modulator 122. The modulated light beam incidents onto hologram storage volume 144, the recorded hologram reflects light in the exact direction of the corresponding original reference beam. The light is focused by lens 136 and incidents onto array of photo detectors 146.

Using the high-resolution spatial light modulator 122 improves storage capacity, speed of recording and reading data. In addition, the optical pattern recognition system 120 optionally permits selective optical feedback that can implement an optical multilevel neural network system. The system 120 can provide either positive or negative optical feedback depending on the duration and energy of laser light pulse and relative timing of applying electrical and optical signals. The incoming laser light pulse selectively heats the reflective elements 13 of the spatial light modulator 122, which alters the sensitivity of the reflective elements 13 to the electric current, such as in the resistive element(s) 16. Depending on power and duration of the light pulse, the state of material to the amorphous or crystalline state can be changes, or an image erased (or a portion thereof) and a new pattern written in the array of reflective elements. Beam splitter 150, optical amplifier 152, mirror 154, and lens 156 implement the optical feedback. Light partially reflects by beam splitter 150, passes through optical amplifier 152, reflects by mirror 154, passes through lens 156 and beam splitter 158 and focuses upon spatial light modulator 122. The optical amplifier 152 is necessary to amplify the light beam so that the output beam is able to directly affect the state of the reflective elements 13 of spatial light modulator 122. Alternatively, the optical pattern recognition system 120 may utilize an electrical system for feedback, comprising an image detector (for example a CCD), a digital or analog signal processing circuit, and a controllable light source such as laser diode.

In a further embodiment, the light focused on the surface of spatial light modulator 122 can be originated from another hologram storage volume, in addition to volume 144. This allows detection of multiple patterns, and thus pattern correlation, or the implementation of a multilevel optical neural network. Further, it should be appreciated that in a simplified embodiment, the holographic optical neural network system 120 can comprise only the elements 122–146, which does not utilize optical feedback.

Figure 6:
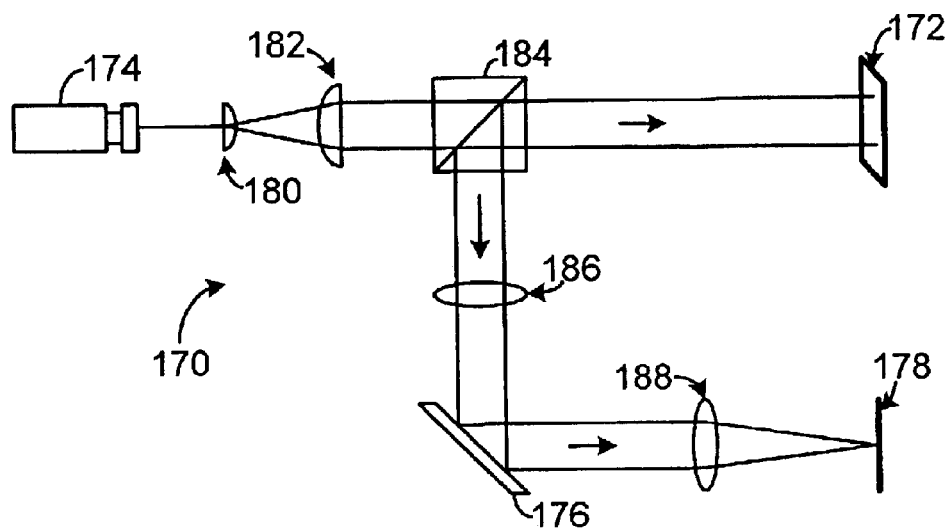
FIG. 6 is another embodiment of a holographic optical neural network.

In the embodiment of holographic optical neural network system 170 shown on FIG. 6, the hologram element itself is comprised of spatial light modulator 176 that displays a hologram pattern used for optical pattern recognition. The hologram pattern may be computed by known computational methods such as a Fourier transform or an extended Fourier transform. The system 170 comprises a high-resolution spatial light modulator 172 that modulates the input beam from laser 174, second high-resolution spatial light modulator 176 for creating hologram pattern, and array of photo detectors 178. Unlike the other disclosed embodiment, this system 170 does not utilize object and reference beams since first step of recording hologram is carried out computationally and hologram pattern is displayed by second spatial light modulator 176. When reading data (detecting or classifying an unknown pattern), light from laser 174 passes through beam expander 180, lens 182, incidents onto first spatial light modulator 172. Spatial light modulator 172 modulates light with input data pattern. Modulated light reflects back, is reflected by beam splitter 184, passes through lens 186, incidents onto second spatial light modulator 176, which displays the computed hologram pattern. The hologram pattern is preferably computed in such a way that reflected light forms a beam at an angle depending on correlation with classifying objects. The reflected light then passes through lens 188 and incidents onto array of photo detectors 178.

This system 170 allows dynamic change of the hologram pattern under the control of an external computing device. A modified hologram pattern can be scanned and loaded back using electrical circuit of the second high resolution spatial light modulator 176 and stored in the computer memory for subsequent computations or replaced by another hologram pattern. Additionally, optical feedback can be carried out similar to device shown on FIG. 5. The optical feedback directed onto hologram element 176 can be used for training an optical neural network system by suppressing patterns that produce undesirable outputs and amplifying patterns that produce desirable outputs.

Figure 7:
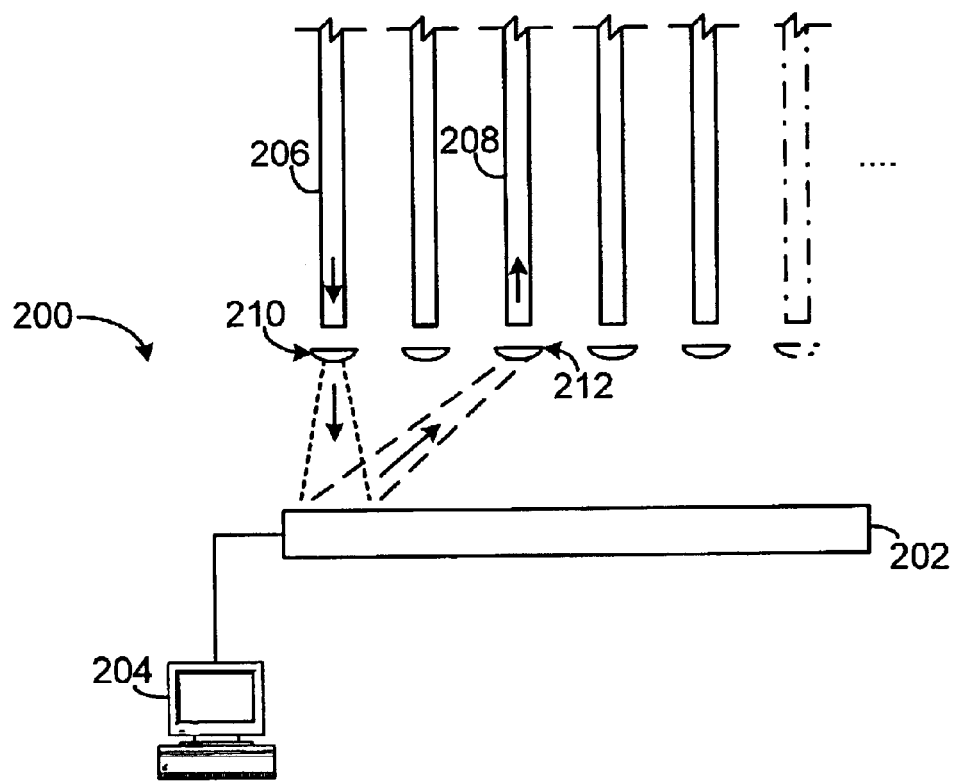
FIG. 7 is a holographic optical signal switching system for telecommunication, the system utilizing the spatial light modulator.

One embodiment of a holographic optical signal switching system 200 for telecommunication is shown on FIG. 7. The system 200 is comprised of a high-resolution spatial light modulator 202 that displays hologram pattern computed by computing device 204, a plurality of optical fibers, such as fibers 206 and 208 with open ends disposed in front of the surface of the spatial light modulator 202, and, optionally, micro-lenses, such as lenses 210 and 212, that are located near the open ends of the optical fibers. To establish communication between given pair of optical fibers, for example fibers number 206 and 208, a hologram pattern is computed by computing device 204 such that light coming from the given source optical fiber, in this example 206, is focused on the given destination optical fiber, in this example 208. The light signal leaves the fiber 206, passes through microlens 210 and is reflected from the spatial light modulator 202 onto microlens 212 and thus is received in fiber 208 for transmission therein. A number of such hologram patterns can be overlapped on the surface of the spatial light modulator 202 to provide a programmable optical interconnection between multiple pairs of optical fibers at the same time. The hologram pattern can be changed dynamically in a very short time due to the aforementioned fact of very fast operation of the spatial light modulator 202. It should be appreciated that the fiber ends can alternately be optical feeds on semiconductor chips and accordingly the system 200 can be utilized for a global optical interconnect between chips in a multi-chip electronic module.

Figure 8:
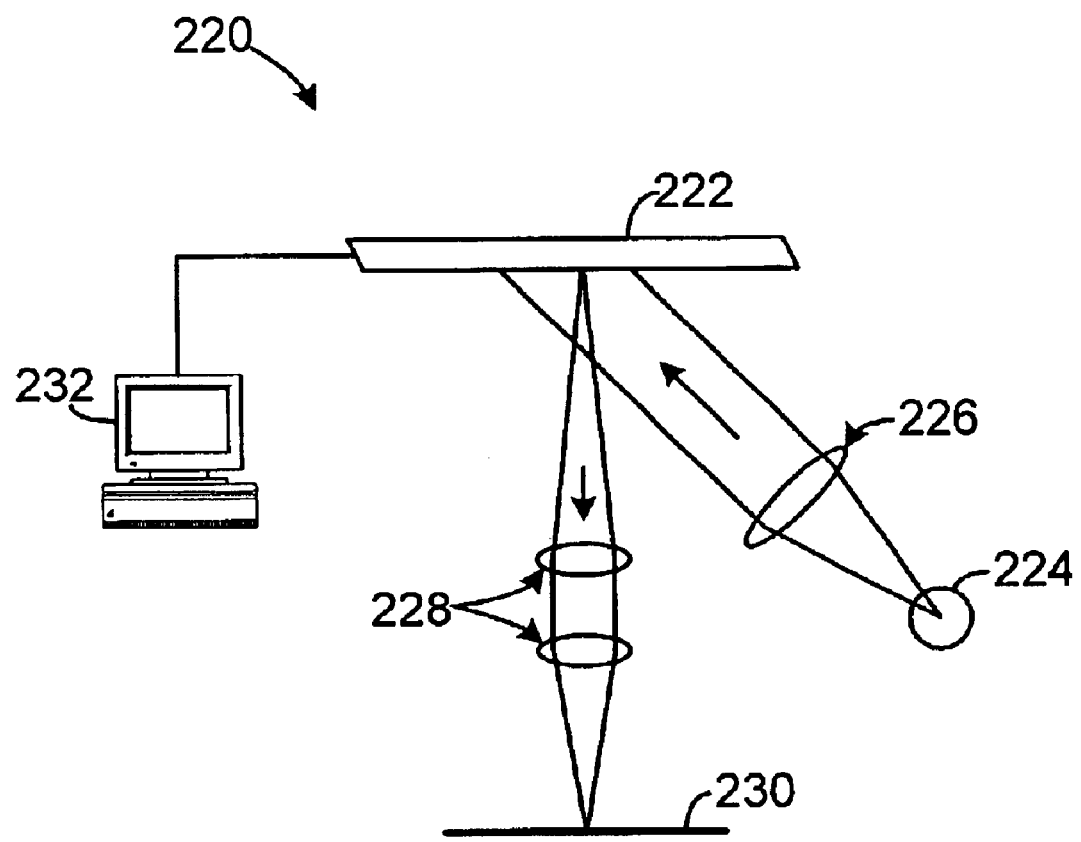
FIG. 8 is a system for a direct-write optical lithography, the system utilizing the spatial light modulator.

FIG. 8 shows one embodiment of a system 220 for direct-write optical lithography. The system 220 is comprised of the high-resolution spatial light modulator 222, light source 224, collimating optical system 226, de-magnifying lenses 228, and substrate 230. In this system 220, the spatial light modulator 222 replaces the photo mask used in traditional optical lithography. Since the high-resolution spatial light modulator 222 reflects the light pattern, the setup of a traditional lithographic system is modified accordingly. In traditional lithographic systems, light passes either through a transparent photo mask or is reflected off of the mask and onto a substrate. In the system 220, the pattern to be imbedded on the substrate 230 is reflected from the spatial light modulator 222, through the de-magnifying lenses 228 and then onto the substrate 230.

An advantage of the present direct-write optical lithography system 220 is the ability to update the pattern dynamically. The computer-generated pattern is delivered by computer system 232 and recorded into the reflective elements 13 of the spatial light modulator 222, and then the lithographic process can start immediately, thus avoiding costly step of fabricating photo masks. Such system 220 is especially suitable for small volume and experimental semiconductor manufacturing since fabrication of photo masks becomes one of the most expensive factors in those endeavors. The system 220 is able to modify semiconductor substrates made in another fabrication process and can dynamically modify the pattern of the chip to avoid the defect points on the substrate, or to compensate or repair the defects.

The ability of spatial light modulator 10 to change the holographic pattern dynamically in a short time allows utilization as a dynamically changeable universal optical element in the system that needs to adapt to external conditions such as diffraction of light in the atmosphere, which is encountered in targeting systems. In a simple embodiment similar to that of FIG. 3, an adaptive optics system can be created to provide targeting and aimpoint selecting in an active 3-D environment. The system comprises the high-resolution spatial light modulator 54, the laser light source 56, and collimating optics 58, and at least one beam splitter (such as beam splitter 98 in FIG. 4) to generate a reference beam. The hologram pattern can be obtained by detecting the interference of reflected and reference laser beams onto a photo detector (such as detector 178 in FIG. 4). Then the hologram pattern is electronically processed and transferred to the array of reflective elements 13 of the high-resolution spatial light modulator 54. The generated hologram pattern then reflects the laser beam in such way that it can be focused on the target despite the diffraction of light in the atmosphere or other factors for distortion of the line of sight. Such system can be utilized for detecting, classification and tracking of fast moving targets.

It can be seen that the use of the modulator 10 thus provides an inventive method of generating a holographic image including the steps of emitting light having a wavelength $\lambda$ from a light source, such as laser 56; receiving the light at a high-resolution spatial light modulator 10, including a substrate 12, an array of optically multistable reflective elements 13 forming a plurality of pixels each having a width thereto, the reflective elements disposed on the substrate 12 and capable of reversible structural change to reflect or absorb incident light having a wavelength $\lambda$ and wherein at least some of the plurality of pixels have a width equal to or less than $\lambda$, and including an image control to selectively control the state of the array of reflective elements 13 to thereby cause the pixels to selectively reflect an image; displaying a hologram pattern with the array of multistable reflective elements 13; and then reflecting light from the array of reflective elements 13 to thereby form a holographic image.

The embodiments and examples set forth herein are presented to best explain the present invention and its practical application and to thereby enable those skilled in the art to make and utilize the invention. Those skilled in the art, however, will recognize that the description and examples are presented for the purpose of illustration and example only. Other variations and modifications of the present invention will be apparent to those of skill in the art, and it is the intent of the appended claims that such variations and modifications be covered. Furthermore, although elements of the invention may be described or claimed in the singular, the plural is contemplated unless it is expressly stated to the contrary.

What is claimed is:

1. A high-resolution spatial light modulator, comprising:
   a substrate;
   an array of optically multistable reflective elements disposed on the substrate and capable of structural change into one of a plurality of stable states wherein each reflective element maintains a stable optical property in each of the plurality of states; and
   a control to selectively control the state of the array of reflective elements to thereby cause each reflective element of the array to selectively reflect incident light such that the array of reflective elements can generate a desired optical image.

2. The spatial light modulator of claim 1, wherein the array of optically multistable reflective elements form a plurality of pixels each having a width, wherein at least some of the plurality of pixels have a width equal to or less than wavelength of incident light $\lambda$.

3. The spatial light modulator of claim 1, wherein the optical reflective elements are made of a chalcogenide alloy.

4. The spatial light modulator of claim 1, wherein optical reflective elements are made of an organic material.

5. The spatial light modulator of claim 1, wherein the control is a circuit, and the array of optically multistable elements (pixels) is formed from a grid of row and column address lines, and the circuit controls each pixel by the row and column address of that pixel.

6. The spatial light modulator of claim 1, wherein each one of the reflective elements is further comprised of a layer of reversible structural change material and a resistive element that heats in response to electric current passing therethrough, and a selective application of electric current thereby causing change of structural state of multistable reflective element.

7. The spatial light modulator of claim 6, further comprising an insulating layer above and below the layer of reversible phase change material.

8. The spatial light modulator of claim 1, wherein the array of reflective elements is comprised of multiple layers of reversible structural change material separated by layers of insulating material.

9. The spatial light modulator of claim 1, wherein the array of reflective elements further comprises a reflective layer below the layer of reversible structural change material.

10. The spatial light modulator of claim 1, wherein the substrate is made of a semiconductor material.

11. The spatial light modulator of claim 1, wherein the substrate is made of an insulator.

12. A holographic display, comprising:
    a high-resolution spatial light modulator, comprising
       a substrate;
       an array of optically multistable reflective elements disposed on the substrate and capable of structural change into one of a plurality of stable states wherein each reflective element maintains a stable optical property in each of the plurality of states; and
       a control to selectively control the state of the array of reflective elements to thereby cause each reflective element of the array to selectively reflect incident light such that the array of reflective elements can generate a desired optical image;
    a light source disposed at an angle to the spatial light modulator and selectively directing light at the array of reflective elements,
    wherein the array of multistable reflective elements generating a holographic image from the reflected light.

13. The display of claim 12, wherein the light source is a laser.

14. The display of claim 13, further comprising a beam expander between the light source and the array of reflective elements.

15. The display of claim 12, further comprising a processor for computing a holographic pattern to display a 3-dimensional image with light reflected from the plurality of reflective elements.

16. The display of claim 12, wherein different reflective elements in the array of reflective elements reflect light of a different wavelength, and further comprising a plurality of light sources for displaying a color 3-dimensional image, each light source having its own wavelength reflected by at least some of the array of reflective elements.

17. A data storage system, comprising:
    a high-resolution spatial light modulator, comprising
       a substrate;
       an array of optically multistable reflective elements disposed on the substrate and capable of structural change into one of a plurality of stable states wherein each reflective element maintains a stable optical property in each of the plurality of states; and
       a control to selectively control the state of the array of reflective elements to thereby cause each reflective element of the array to selectively reflect incident light such that the array of reflective elements can generate a desired optical image;
    a laser light source emitting a beam of light;
    a beam splitter separating the light beam emitted from the laser light source onto object and reference beams;
    a shutter, selectively letting the object light beam through at time of data recording, and blocking object beam at time of data reconstructing;
    a rotating mirror, reflecting reference beam at selectively controlled angle;
    a hologram storage volume, storing at least one hologram; and
    an array of photo detectors, detecting reconstructed data pattern.

18. The system of claim 17, wherein a plurality of data patterns is stored in the hologram storage volume by angle multiplexing, implemented by changing angle positions of the rotating mirror, and data is reconstructed by illuminating the hologram storage volume with the light reflected at the same angle position of the rotating mirror.

19. A pattern recognition system, comprising:
    a high-resolution spatial light modulator, comprising
       a substrate;
       an array of optically multistable reflective elements disposed on the substrate and capable of structural change into one of a plurality of stable states wherein each reflective element maintains a stable optical property in each of the plurality of states; and a control to selectively control the state of the array of reflective elements to thereby cause each reflective element of the array to selectively reflect incident light such that the array of reflective elements can generate a desired optical image;

a first light source that selectively focuses a beam of light on the array of reflective elements;

a beam splitter separating the light beam of the first light source into object and reference beams;

a second light source that focuses incident feedback light on the array of reflective elements to thereby generate an optical feedback signal;

a circuit for amplifying and processing the feedback signal;

a hologram storage volume containing at least one holographic pattern; and an array of photo detectors, wherein the image detector determines the presence of the at least one holographic pattern in the incident light based upon the feedback signal.

20. The system of claim 19, wherein a plurality of the pattern recognition systems create an optimizable neural network wherein selective optical feedback trains the neural network by positively influencing hologram patterns that produce a desirable response and negatively influencing hologram patterns that produce an undesirable response.

21. A holographic optical signal switching system, comprising:

a high-resolution spatial light modulator, comprising
a substrate;
an array of optically multistable reflective elements disposed on the substrate and capable of structural change into one of a plurality of stable states wherein each reflective element maintains a stable optical property in each of the plurality of states; and
a control to selectively control the state of the array of reflective elements to thereby cause each reflective element of the array to selectively reflect incident light such that the array of reflective elements can generate a desired optical image;

an array of optical fibers with at least some of the optical fibers having open ends disposed in front of the spatial light modulator;

a plurality of micro-lenses, each of which is located near an open end of an optical fibers; and a device for synthesis of a holographic pattern, wherein the device establishes communication between given pair of optical fibers by computing a holographic pattern and then displaying the holographic pattern on the spatial light modulator such that light from a given source optical fiber is reflected and focused upon the open end of the destination optical fiber.

22. The system of claim 21, wherein independent simultaneous communication between a plurality of pairs of optical fibers is established by displaying a superposition of multiple overlapped hologram patterns.

23. The system of claim 21, further comprising at least one semiconductor chip, each chip having at least one optical transmitter and optical receiver, the transmitter and the receiver disposed in front of the spatial light modulator, and respective micro-lenses are located near the optical transmitter and optical receivers.

24. A direct-write optical lithography system, comprising:

a high-resolution spatial light modulator, comprising
a substrate;
an array of optically multistable reflective elements disposed on the substrate and capable of structural change into one of a plurality of stable states wherein each reflective element maintains a stable optical property in each of the plurality of states; and
a control to selectively control the state of the array of reflective elements to thereby cause each reflective element of the array to selectively reflect incident light such that the array of reflective elements can generate a desired optical image;

a light source;

a light collimating system;

a demagnifying optical system for focusing an image generated by the spatial light modulator onto a substrate; and a processor for generating and storing image patterns.

25. A system for illuminating, tracking and aimpoint selection of moving targets, comprising:

a first laser for initial illumination of a target;

a second laser frequency-locked with first laser and generating a reference beam;

an array of photodetectors for detecting an interference pattern produced by the first laser beam reflected from a target and the second reference laser beam;

a digital image processing system for synthesis of a hologram, including:

a high-resolution spatial light modulator for displaying a hologram, comprising
a substrate;
an array of optically multistable reflective elements disposed on the substrate and capable of structural change into one of a plurality of stable states wherein each reflective element maintains a stable optical property in each of the plurality of states; and
a control to selectively control the state of the array of reflective elements to thereby cause each reflective element of the array to selectively reflect incident light such that the array of reflective elements can generate a desired optical image;

a laser illuminating said spatial light modulator; and a collimating optics for directing reflected light from the spatial light modulator onto the target, wherein a hologram is computed by the digital image processing system such that reflected laser light produces a conjugate light beam that is focused upon the target.

26. The system of claim 25, wherein the hologram is calculated and updated in real time to reflect the 3-dimensional position of the moving target.

27. A method of generating a holographic image, comprising the steps of:

emitting light having a wavelength $\lambda$ from a light source;

receiving the light at a high-resolution spatial light modulator, including a substrate, an array of optically multistable reflective elements forming a plurality of pixels each having a width thereto, the reflective elements disposed on the substrate and capable of reversible structural change to reflect or absorb incident light having a wavelength $\lambda$, and wherein at least some of the plurality of pixels have a width equal to or less than $\lambda$, and including a control to selectively control the state of the array of reflective elements to thereby cause the pixels to selectively reflect an image;

displaying a hologram pattern with the array of multistable reflective elements; and reflecting light from the array of reflective elements to thereby form a holographic image.

28. The method of claim 27, wherein the step of emitting light is emitting a light beam from a laser.

29. The method of claim 28, further comprising the step of expanding the light beam between the laser light source and the array of reflective elements.

30. The method of claim 27, further comprising the step of computing a holographic image to display a 3-dimensional image with light reflected from the plurality of reflective elements.

31. The method of claim 27, further comprising step of a displaying a color 3-dimensional image based upon light from a plurality of light sources, each light source having its own wavelength λ wherein the spatial light modulator displaying a superposition of a plurality of overlapped holograms, each hologram a distinct color component of the image.

32. A method of holographic transmission of a remote 3-dimensional image, comprising the steps of:

acquiring data representing a 3-dimensional image;

digitizing the 3-dimensional image data;

transmitting the digitized data;

receiving the digitized data at a receiver;

generating a holographic image by conversion of the digitized data; and displaying the holographic image on a high-resolution spatial light modulator comprised of:

a substrate, an array of optically multistable reflective elements disposed on the substrate and capable of structural change into one of a plurality of stable states wherein each reflective element maintains a stable optical property in each of the plurality of states; and a control to selectively control the state of the array of reflective elements to thereby cause each reflective element of the array to selectively reflect incident light such that the array of reflective elements can generate a desired optical image;

emitting light from a light source disposed at an angle to the spatial light modulator and selectively directing light at the array of reflective elements;

wherein the array of multistable reflective elements displays a hologram pattern, thereby generating a holographic image from the reflected light.

33. The method of claim 32, wherein the step of acquiring data representing a 3-dimensional image is comprised of the steps of:

emitting a light beam from a laser;

splitting the light beam into reference and object beams;

illuminating the image with the object light beam; and generating a hologram pattern on an array of photo detectors by interference of reference light beam and light reflected from the image.

34. The method of claim 32, wherein the step of acquiring data representing a 3-dimensional image is comprised of the steps of:

viewing the image with each of a plurality of cameras, each camera capable of at least gathering a stereoscopic image;

gathering the stereoscopic representations of the image from each of the plurality of stereoscopic cameras; and generating data representing a 3-dimensional image based upon the images gathered from the plurality of cameras.

35. The method of claim 32, further comprising the steps of:

converting the transmitted digitized data into a stereoscopic image; and displaying said stereoscopic image on a stereoscopic display.

36. The method of claim 32, wherein the step of acquiring data representing a 3-dimensional image occurs at least at 24 images per second.

37. The method of claim 32, further comprising the steps of:

compressing the digitized data by generating a compact standard-based digital representation of 3-dimensional scene, which comprises a digital description of geometrical shape and visual properties of 3-dimensional objects within the scene;

transmitting the compressed data; and decompressing received data by converting the compact standard-based digital representation to complete digital data suitable for displaying the 3-dimensional image.

* * * * *